United States Patent
Noble et al.

(10) Patent No.: US 7,282,400 B2
(45) Date of Patent: Oct. 16, 2007

(54) METHOD AND APPARATUS ON (110) SURFACES OF SILICON STRUCTURES WITH CONDUCTION IN THE <110> DIRECTION

(75) Inventors: Wendell P. Noble, Milton, VT (US); Leonard Forbes, Corvallis, OR (US); Alan R. Reinberg, Westport, CT (US)

(73) Assignee: Micron Technology, Inc., Boise, ID (US)

( * ) Notice: Subject to any disclaimer, the term of this patent is extended or adjusted under 35 U.S.C. 154(b) by 42 days.

(21) Appl. No.: 11/358,583

(22) Filed: Feb. 21, 2006

(65) Prior Publication Data

US 2006/0141697 A1 Jun. 29, 2006

Related U.S. Application Data

(60) Continuation of application No. 10/930,213, filed on Aug. 31, 2004, now Pat. No. 7,045,880, which is a division of application No. 10/463,261, filed on Jun. 17, 2003, now Pat. No. 6,960,821, which is a division of application No. 09/850,764, filed on May 8, 2001, now Pat. No. 6,580,154, which is a division of application No. 09/386,181, filed on Aug. 31, 1999, now Pat. No. 6,245,615.

(51) Int. Cl.
*H01L 21/337* (2006.01)

(52) U.S. Cl. ............... 438/193; 438/242; 257/E21.548

(58) Field of Classification Search ............... 438/193, 438/242, 270, 304
See application file for complete search history.

(56) References Cited

U.S. PATENT DOCUMENTS 3,999,282 A 12/1976 Ono et al.
4,466,178 A 8/1984 Soclof
4,651,188 A 3/1987 Hayashi et al.
4,667,215 A 5/1987 Kawamura et al.
4,768,076 A 8/1988 Aoki et al.
4,778,583 A 10/1988 Wagner et al.
4,833,516 A 5/1989 Hwang et al.
4,857,986 A 8/1989 Kinugawa
5,082,795 A 1/1992 Temple
5,192,680 A 3/1993 Naruse et al.
5,196,722 A 3/1993 Bergendahl et al.
5,364,810 A 11/1994 Kosa et al.

(Continued)

OTHER PUBLICATIONS

Balk, P., "Orientation Dependence of Built-In Surface Charge on Thermally Oxidized Silicon", *IEEE*, 53, (1965), 2133-2134.

(Continued)

*Primary Examiner*—David W. Coleman
(74) *Attorney, Agent, or Firm*—Schwegman, Lundberg & Woessner, P.A.

(57) ABSTRACT

Improved methods and structures are provided that are lateral to surfaces with a (110) crystal plane orientation such that an electrical current of such structures is conducted in the <110> direction. Advantageously, improvements in hole carrier mobility of approximately 50% can be obtained by orienting the structure's channel in a (110) plane such that the electrical current flow is in the <110> direction. Moreover, these improved methods and structures can be used in conjunction with existing fabrication and processing techniques with minimal or no added complexity.

26 Claims, 8 Drawing Sheets

U.S. PATENT DOCUMENTS

| | | | |
|---|---|---|---|
| 5,371,383 | A | 12/1994 | Miyata et al. |
| 5,583,368 | A | 12/1996 | Kenney |
| 5,770,878 | A | 6/1998 | Beasom |
| 5,801,089 | A | 9/1998 | Kenney |
| 5,883,012 | A | 3/1999 | Chiou et al. |
| 5,888,880 | A | 3/1999 | Gardner et al. |
| 5,904,543 | A | 5/1999 | Wang |
| 5,907,170 | A | 5/1999 | Forbes et al. |
| 5,915,180 | A | 6/1999 | Hara et al. |
| 5,991,225 | A | 11/1999 | Forbes et al. |
| 5,998,263 | A | 12/1999 | Sekariapuram et al. |
| 6,015,737 | A | 1/2000 | Tokura et al. |
| 6,066,869 | A | 5/2000 | Noble et al. |
| 6,072,209 | A | 6/2000 | Noble et al. |
| 6,091,102 | A | 7/2000 | Sekariapuram et al. |
| 6,097,065 | A | 8/2000 | Forbes et al. |
| 6,108,239 | A | 8/2000 | Sekariapuram et al. |
| 6,255,684 | B1 | 7/2001 | Roesner et al. |
| 6,320,215 | B1 | 11/2001 | Bronner et al. |
| 6,358,867 | B1 | 3/2002 | Tews et al. |
| 6,362,494 | B1 | 3/2002 | Yagi |
| 6,383,871 | B1 | 5/2002 | Noble et al. |
| 6,593,613 | B1 | 7/2003 | Alsmeier et al. |
| 6,887,749 | B2 | 5/2005 | Noble et al. |
| 6,960,821 | B2 | 11/2005 | Noble et al. |
| 2005/0023593 | A1 | 2/2005 | Noble et al. |
| 2005/0026369 | A1 | 2/2005 | Noble et al. |

OTHER PUBLICATIONS

Carr, W. N., et al., *In: MOS/LSI Design and Application*McGraw-Hill Book Company, New York,(1972),pp. 37, 49-52.

Crowder, S., et al., "Trade-offs in the Integration of High Performance Devices with Trench Capacitor DRAM", *Dig. Int. Electron Devices Meeting*, Washington, D.C., (Dec. 1997),pp. 45-48.

Deal, B. E., et al., "Charateristics of the Surface-State Charge (Q) of Thermally Oxidized Silicon", *J. Electrochem. Soc.: Solid State Science*, (1967),pp. 266-274.

Hodges, D. A., et al., *In: Analysis and Design of Digital Integrated Circuits, Second Edition*, McGraw-Hill, Inc., New York, (1988),p. 342-344.

Irene, E. A., "The Effects of Trace Amounts of Water on the Thermal Oxidation of Silicon in Oxygen", *Journal of the Electrochemical Society: Solid-State Science and Technology*, (1974),pp. 1613-1616.

Kim, Han-Soo, et al., "The 600V Rating n-ch Trench IGBT with the Low Leakage Current and the High Channel Mobility Using the (101) Oriented Trench Sidewall", *IEEE*, Document No. 0-7803-3993-2/97,(1997),265-268.

King, Y., et al., "Sub-5nm Multiple-Thickness Gate Oxide Technology Using Oxygen Implantation", *IEDM Technical Digest*, (1998),pp. 585-588.

Liu, C. T., et al. "Multiple Gate Oxide Thickness for 2GHz System-on-A-Chip Technologies", *IEDM Technical Digest*, (1998),pp. 589-592.

Peirret, R. F., *Semiconductor Fundamentals, Second Edition*, Modular Series on Solid State Devices, vol. 1, Pierret, R.F., et al., (eds.), Addison-Wesley Publishing Co., Reading, MA,(Apr. 1989), p. 3-13.

Petti, C. J., et al., "Characterization of Surface Mobility on the Sidewalls of Dry-Etched Trenches", *IEEE IEDM '88*, (1988),104-107.

Sato, T., et al., "Drift-Velocity Saturation of Holes in Si Inversion Layers", *J. Phys. Soc. Japan*, 31(6), (1971),1846.

Shenai, K., "A 55-V, 0.2-microohm-cm2 Vertical Trench Power MOSFET", *IEEE Electron Device Letters*, 12, (Mar. 1991),108-110.

Shenai, K., "Electron Mobilities in MOS Channels Formed Along Anisotropically Dry Etched <110> Silicon Trench Sidewalls", *Electronics Letters*, 27 , (Apr. 25, 1991),715-717.

Theil, J. A., "Deep Trench Fabrication by Si (110) Orientation Dependent Etching", *Journal of Vacuum Science & Technology B: Microelectronics and Nanometer Structures*, Abstract, obtained from http://ojps.aip.org/>, (Sep. 1995),1 p.

Togo, M., et al., "Multiple-Thickness Gate Oxide and Dual-Gate Technologies for High Performance Logic-Embedded DRAms", *IEDM Technical Digest*, (1998),pp. 347-350.

Vitkavage, S. C., et al., "An investigation of Si-SiO2 interface charges in thermally oxidized (100), (110), (111), and (511) silicon", *J. Appl. Phys.*, 68(10), (1990),pp. 5262-5272.

METHOD AND APPARATUS ON (110) SURFACES OF SILICON STRUCTURES WITH CONDUCTION IN THE <110> DIRECTION

RELATED APPLICATIONS

This application is a Continuation of U.S. Ser. No. 10/930,213, filed Aug. 31, 2004, now U.S. Pat. No. 7,045,880 which is a Divisional of U.S. Ser. No. 10/463,261, filed Jun. 17, 2003, now U.S. Pat. No. 6,960,821, which is a Divisional of U.S. Ser. No. 09/850,764, filed May 8, 2001, now U.S. Pat. No. 6,580,154, which is a Divisional of U.S. Ser. No. 09/386,181 filed Aug. 31, 1999, now U.S. Pat. No. 6,245,615, all of which are incorporated herein by reference. This application is related to application Ser. No. 09/386,185, filed on Aug. 31, 1999, now U.S. Pat. No. 6,383,871, which is hereby incorporated by reference. This application is further related to application Ser. No. 09/386,313, filed on Aug. 31, 1999, now U.S. Pat. No. 6,483,171, which is hereby incorporated by reference. This application is also related to application Ser. No. 09/386,315, filed on Aug. 31, 1999, now U.S. Pat. No. 6,436,748, which is hereby incorporated by reference.

FIELD OF THE INVENTION

The present invention relates to integrated circuits, and more particularly, to a method, a structure and a system for providing semiconductor devices on (110) surfaces with conduction in the <110> direction.

BACKGROUND OF THE INVENTION

In general, the standard silicon wafer crystal orientation for VLSI (Very Large Scale Integration) is the (100) orientation. This surface orientation was chosen over the previously used (111) crystal orientation because of its comparatively low surface state density on thermally oxidized surfaces. In particular, a (111) crystal orientation has a surface state charge density of approximately $5 \times 10^{11}$ e/centimeters$^2$ (cm$^2$) in comparison with a (100) crystal orientation which has a surface state charge density of approximately $9 \times 10^{10}$ e/cm$^2$.

Surface state density was a particularly important consideration for n-channel Metal Oxide Semiconductor (NMOS) technologies because the higher this surface state density level the more difficult the controlling of active and parasitic device threshold voltages for devices using such technologies. For (110) surfaces, the surface state charge density is approximately $2 \times 10^{11}$ e/cm$^2$ which is approximately twice the density level for (100) surfaces. In present day technology, this difference in density levels translates into less than 0.09 volts offset in active device threshold voltage and is readily compensated by a surface threshold voltage ion implant. A further benefit to a lower surface state charge density for NMOS devices is that the electron mobility in inversion layers is greater on the (100) surface than on other lower order planes.

However, for modern day complimentary metal oxide semiconductor (CMOS) technology involving sub-micron devices, a different set of trade-offs are involved. For such short channel devices, the NMOS devices operate largely in velocity saturation resulting in a source to drain current which is independent of crystal orientation.

In contrast as illustrated in FIGS. 1 and 2, p-channel Metal Oxide Semiconductor (PMOS) devices are less likely to operate in velocity saturation, and therefore are more dependent on the choice of crystal orientation around inversion layer hole mobility. In particular, FIG. 1 includes a transistor 100, which can be either an NMOS or PMOS transistor. Transistor 100 is comprised of a silicon wafer 102, a source region 104, a drain region 106, a gate 108, an oxide layer 110, a body region 111 and a channel region 112 between the source region 104 and the drain region 106. As is well-known in the art, a voltage differential between the source region 104 and the drain region 106 induces an electric field across the channel region 112. A gate potential applied to the gate 108 can create an inversion layer in the body region 111 allowing the channel region 112 to form between the source region 104 and the drain region 106. This electric field is expressed in terms of the voltage differential between the source region 104 and the drain region 106 per the length of the channel region 112.

FIG. 2 illustrates a graph of the drift velocity for carriers (i.e., either holes or electrons) across the channel region 112, expressed in cm/second (sec), versus an average source-to-drain electric field, expressed in volts/cm. In particular, a plot 202 is the graphical plot of the drift velocity of electrons in the channel of an NMOS versus the electric field generated by the voltage differential between the source region 104 and the drain region 106. Additionally, a plot 204 is the graphical plot of the drift velocity of holes in the channel of a PMOS versus the electric field generated by the voltage differential between the source region 104 and the drain region 106. As illustrated, the plot 202 reaches velocity saturation at approximately $10^4$ V/cm (i.e., the point in which the graphical plot flattens). In contrast in the graph of FIG. 2, the plot 204 has not reached the point of velocity saturation, even at $10^5$ V/cm. Thus, a PMOS device that uses holes as carriers is more dependent on the choice of crystal orientation for inversion hole mobility.

Currently, surfaces with a (110) crystal plane orientation have been explored in the planar bulk and Silicon On Insulator (SOI) technologies by using (110) substrate wafers or causing the recrystallization of the surface of a substrate wafer to have a (110) crystal orientation. However, these structures and methods require re-tooling of crystal growth mechanisms used in conjunction with the standard (100) crystalline plane orientation and/or otherwise introduce costly, additional processing steps and procedures.

Thus, there is a need for structures and methods which improve carrier mobility in semiconductor devices and which do so without the introduction of costly additional processing steps or which require any re-tooling of standard crystal growth mechanisms. For these and other reasons there is a need for the present invention.

SUMMARY OF THE INVENTION

The above-mentioned problems and limitations associated with carrier mobility in semiconductor devices and other problems are addressed by the present invention and will be understood by reading and studying the following specification. Structures and methods are described which accord improved benefits.

Improved methods and structures are provided that are lateral to surfaces with a (110) crystal plane orientation in which an electrical current of such structures is in a <110> direction. Advantageously, improvements in carrier mobility of approximately 50% can be obtained by orienting the structure's channel in a (110) plane such that the electrical current flow is in the <110> direction. Moreover, these improved methods and structures can be used in conjunction with existing fabrication and processing techniques with minimal or no added complexity.

Embodiments of a method of forming an integrated circuit include forming a trench in a silicon wafer. A trench wall of the trench has a (110) crystal plane orientation. A semiconductor device is also formed lateral to the trench wall such that the semiconductor device is capable of conducting an electrical current in a <110> direction.

One method of the present invention provides for forming an integrated circuit. Another method includes forming an integrated circuit including an array of MOSFETs while another method includes forming an integrated circuit including a number of lateral transistors. Another method includes forming a semiconductor device. Moreover, other embodiments provide for forming MOSFET devices (e.g., PMOS and NMOS devices). The present invention also includes structures as well as systems incorporating such structures all formed according to the methods provided in this application.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1:
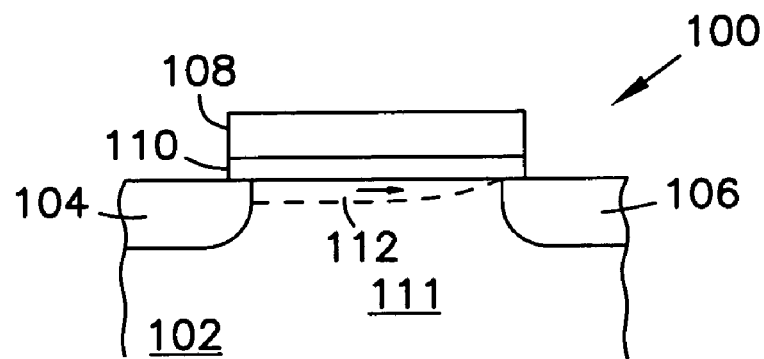
FIG. 1 is a cross-sectional view of a MOSFET device.
Figure 2:
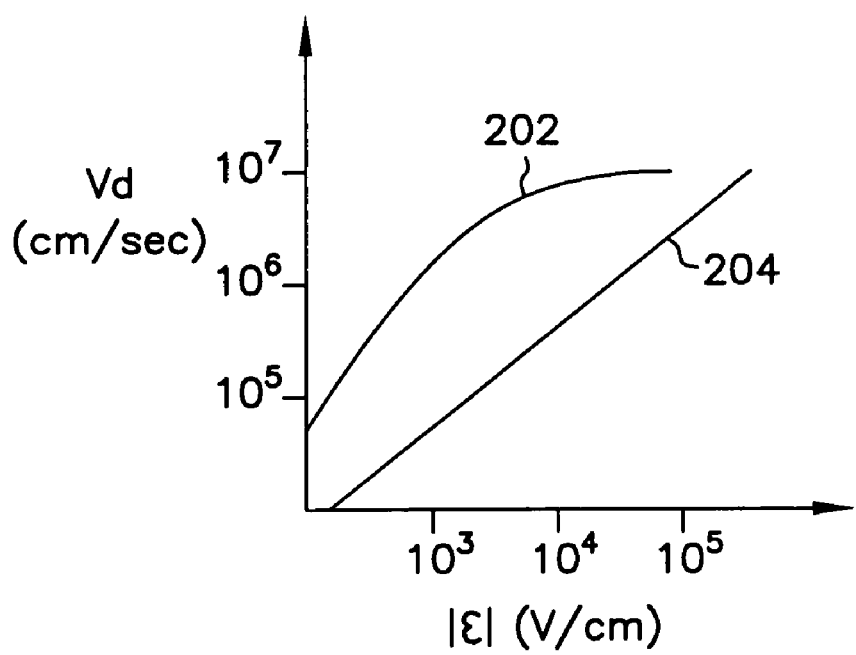
FIG. 2 is a graph that illustrates a drift velocity of carriers of a MOSFET device vs. average source-to-drain electric field for the MOSFET device.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

In particular, an illustrative embodiment of the present invention includes a method of forming an integrated circuit. The method includes forming a trench in a silicon wafer. A trench wall of the trench has a (110) crystal plane orientation. Additionally, a semiconductor device is formed lateral to the trench wall. Moreover, the semiconductor device is capable of conducting an electrical current in a <110> direction.

Another embodiment of the present invention includes a method of forming a semiconductor device. This method includes forming a first conductive region of a first type in a trench of a silicon wafer. In particular, the first conductive region of the first type is lateral to a trench wall of the trench with the trench wall having a (110) crystal plane orientation. Moreover, a second conductive region of the first type is formed in the trench. The second conductive region of the first type is formed lateral to the trench wall. The method also includes forming a conductive region of a second type in the trench. In particular, this conductive region of the second type is lateral to the trench wall and between the first and second conductive regions of the first type. Additionally, an electrical current is capable of flowing between the first and the second conductive regions of the first type in a <110> direction.

An alternative method embodiment of the present invention includes forming an integrated circuit which includes a number of lateral transistors. The method includes forming a trench in a silicon wafer, which has a top surface having a (100) crystal plane orientation. Additionally, the trench has a trench wall with a (110) crystal plane orientation. The method also includes forming a first conductive region in a first portion of the trench. In particular, this first conductive region is lateral to the trench wall. Moreover, a second conductive region is formed in a second portion of the trench such that this second conductive region is lateral to the trench wall. The method also includes forming a third conductive region in a third portion of the trench. This third conductive region is lateral to the trench wall and between the first and second conductive regions. Moreover, an electrical current is capable of flowing between the first conductive region and the second conductive region in a <110> direction.

Another method embodiment of the present invention includes forming a p-channel Metal Oxide Semiconductor Field Effect Transistor (p-MOSFET) device. This method includes forming a trench in a silicon wafer such that the trench includes a trench wall having a (110) crystal plane orientation. Additionally, a first conductive p-type region is formed in the trench of the silicon wafer. In particular, this first conductive p-type region is lateral to the trench wall of the trench. The method also includes forming a second conductive p-type region in the trench such that the second conductive p-type region is lateral to the trench wall. Further a conductive n-type region is formed in the trench. This conductive n-type region is formed lateral to the trench wall and between the first and second conductive p-type regions. Additionally, the p-MOSFET device is configured for conducting an electrical current between the first and the second conductive p-type regions in a direction lateral to the trench wall.

An additional method embodiment of the present invention includes forming an integrated circuit including an array of Metal Oxide Semiconductor Field Effect Transistors (MOSFETs). The method includes forming a number of trenches in a silicon wafer such that the number of trenches have a trench wall in a (110) crystalline plane orientation. The method also includes forming a number of spaced MOSFETs in each trench. The formation of the number of spaced MOSFETs includes forming a first conductive p-type region in the trench of the silicon wafer such that the first conductive p-type region is lateral to the trench wall of the trench. Further, a second conductive p-type region is formed in the trench such that the second conductive p-type region is lateral to the trench wall. The formation of the number of spaced MOSFETs also includes forming a conductive n-type region in the trench such that the conductive n-type region is lateral to the trench wall and between the first and the second conductive p-type regions. Additionally, an electrical current is capable of flowing between the first and the second p-type regions in a <110> direction.

An apparatus embodiment of the present invention includes an integrated circuit. The integrated circuit includes a trench wall in a silicon wafer in which the trench wall has a (110) crystal plane orientation. The integrated circuit also includes a semiconductor device lateral to the trench wall. Moreover, the semiconductor device is configured to conduct an electrical current in the <110> direction.

Another apparatus embodiment of the present invention includes a semiconductor device. The semiconductor device includes a first conductive region of a first type in a trench of a silicon wafer. This first conductive region of the first type is lateral to a trench wall of the trench, and the trench wall has a (110) crystal plane orientation. The semiconductor device also includes a second conductive region of the first type in the trench. This second conductive region of the first type is lateral to the trench wall. Additionally, the semiconductor device includes a conductive region of a second type in the trench. This conductive region of the second type is lateral to the trench wall and between the first and second conductive regions of the first type. Moreover, the semiconductor device is designed to conduct an electrical current between the first and second conductive regions of the first type in a <110> direction.

An alternative apparatus embodiment of the present invention includes a dynamic random access memory (DRAM). The DRAM includes an array of lateral transistors formed on a trench wall of a trench in a silicon wafer such that the silicon wafer has a top surface in a (100) crystal plane orientation and the trench wall has a (110) crystal plane orientation. Additionally, each lateral transistor includes a first conductive region in a first portion of the trench wall. Each lateral transistor also includes a second conductive region in a second portion of the trench wall. Further, each lateral transistor includes a third conductive region in a third portion of the trench wall, such that the third conductive region is between the first and second conductive regions. Additionally, each lateral transistor is configured to conduct an electrical current between the first conductive regions and the second conductive region in a <110> direction. The DRAM also includes a wordline coupled to a gate of each lateral transistor formed on the trench wall of the trench of the silicon wafer.

Another apparatus embodiment of the present invention includes a p-channel Metal Oxide Semiconductor Field Effect Transistor (p-MOSFET) device. The p-MOSFET device includes a first conductive p-type region in a trench of a silicon wafer. This first conductive p-type region is lateral to a trench wall of the trench with the trench wall having a (110) crystal plane orientation. The p-MOSFET device also includes a second conductive p-type region in the trench in which the second conductive p-type region is lateral to the trench wall. Additionally, the p-MOSFET device includes a conductive n-type region in the trench. This conductive n-type region is lateral to the trench wall and between the first and second conductive p-type regions. Moreover, an electrical current is capable of flowing between the first and second conductive p-type regions in a direction lateral to the trench wall.

Another apparatus embodiment of the present invention includes an array of Metal Oxide Semiconductor Field Effect Transistors (MOSFETs). The array of MOSFETs includes a number of trenches formed in a silicon wafer. The array of MOSFETs also includes a number of spaced MOSFETs in each trench. Each MOSFET includes a first conductive p-type region in a trench of the silicon wafer such that the first conductive p-type region is lateral to a trench wall of the trench. The trench wall has a (110) crystal plane orientation. Each MOSFET also includes a second conductive p-type region in the trench such that the second conductive p-type region is lateral to the trench wall. Further, each MOSFET includes a conductive n-type region in the trench such that the conductive n-type region is lateral to the trench wall and between the first and second conductive p-type regions. Additionally, an electrical current is capable of flowing between the first and second conductive p-type regions in a <110> direction.

An alternative apparatus embodiment of the present invention includes an electronic system. This electronic system includes a processor. This electronic system also includes an integrated circuit coupled to the processor. In particular, the integrated circuit is formed on a silicon wafer. The silicon wafer includes a trench wall that has a (110) crystal plane orientation. The silicon wafer also includes a semiconductor device lateral to the trench wall. The semiconductor device is capable of conducting an electrical current in a <110> direction.

Another apparatus embodiment of the present invention includes an electronic system. The electronic system includes a processor as well as a semiconductor device coupled to the processor. The semiconductor device includes a first conductive region of a first type in a trench of a silicon wafer. In particular, the first conductive region of the first type is lateral to a trench wall of the trench, and the trench wall has a (110) crystal plane orientation. The semiconductor device also includes a second conductive region of the first type in the trench. This second conductive region of the first type is lateral to the trench wall. Additionally, the semiconductor device includes a conductive region of a second type in the trench. In particular, the conductive region of the second type is lateral to the trench wall and between the first and second conductive regions of the first type. Moreover, an electrical current is capable of flowing between the first and second conductive regions of the first type in a <110> direction.

An alternative apparatus embodiment of the present invention includes an electronic system. The electronic system includes a processor as well as a memory coupled to the processor. The memory includes an array of lateral transistors formed on a trench wall of a trench in a silicon wafer. The silicon wafer has a top surface with a (100) crystal plane orientation, and the trench wall has a (110) crystal plane orientation. Additionally, each lateral transistor in the array of lateral transistors includes a first conductive region in a first portion of the trench in which the first conductive region is lateral to the trench wall. Moreover, each lateral transistor includes a second conductive region in a second portion of the trench. In particular, this second conductive region is lateral to the trench wall. Each lateral transistor also includes a third conductive region in a third portion of the trench. This third conductive region is lateral to the trench wall and between the first and second conductive regions. Moreover, an electrical current is capable of flowing between the first conductive region and the second conductive region in a <110> direction.

Figure 3A:
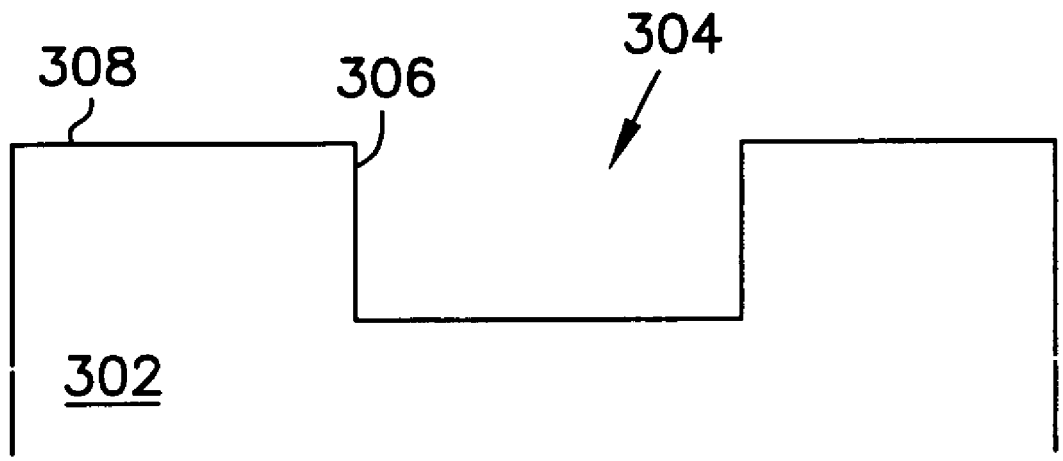
FIGS. 3A-3B illustrate an embodiment of a process of fabrication of conduction regions on a silicon wafer according to the teachings of the present invention.
Figure 3B:
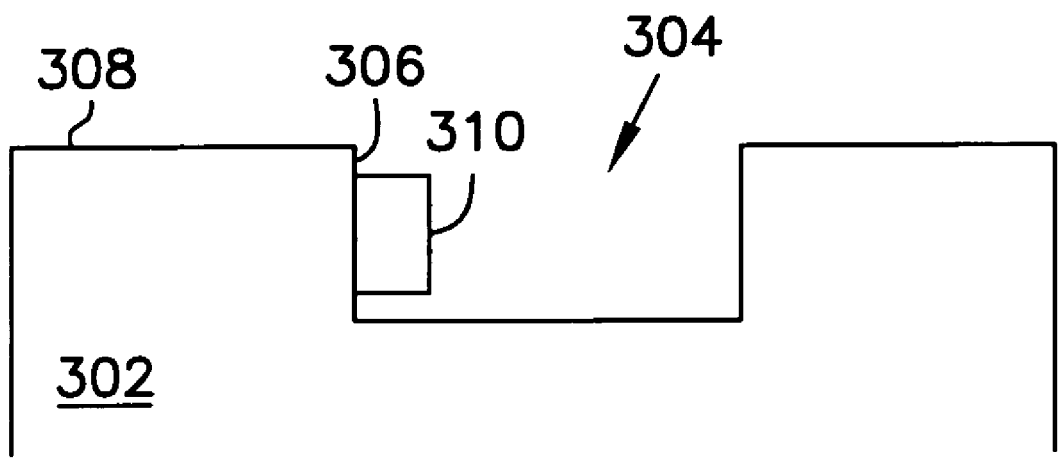

FIGS. 3A-3B illustrate an embodiment of a process of fabrication of conduction regions on a silicon wafer according to the teachings of the present invention. The sequence can be followed as a method of forming an integrated circuit, as a method of forming a semiconductor device, as a method of forming an integrated circuit that includes a number of lateral transistors and as a method of forming a MOSFET device.

FIG. 3A shows the structure after the first sequence of processing. A trench 304 is formed in a silicon wafer 302 using photolithography and etching techniques. One of ordinary skill in the art will understand the manner in which photolithography and etching techniques can be used to form a trench in a silicon wafer. According to the teachings of the present invention, the trench 304 is specifically formed such that a trench wall 306 of the trench 304 has a (110) crystal plane orientation. In one embodiment, the silicon wafer 302 has a top surface 308 that has a (100) crystal plane. However, it is important to appreciate that the top surface 308 may have other specific crystal plane orientations (e.g., (111) crystal plane orientation). In one embodiment, the silicon wafer 302 includes a bulk silicon material. In an alternative embodiment, the silicon wafer 302 includes a Silicon On Insulator (SOI) material.

FIG. 3B shows the structure after the next sequence of processing. A semiconductor device 310 is formed in the trench 304 using standard photolithography, etching, ion implantation and other processing techniques. In particular, the semiconductor device 310 is formed lateral to the trench wall 306. Moreover, in one embodiment, the semiconductor device 310 is formed in the trench 304 such that it is capable of conducting an electrical current in a <110> direction. In one embodiment, the electrical current is capable of conducting an electrical current lateral to the trench wall 306. In one embodiment, the semiconductor device 310 is a MOSFET device. In one such embodiment, the semiconductor device 310 is a PMOS device. In another such embodiment, the semiconductor device 310 is an NMOS device.

Figure 4:
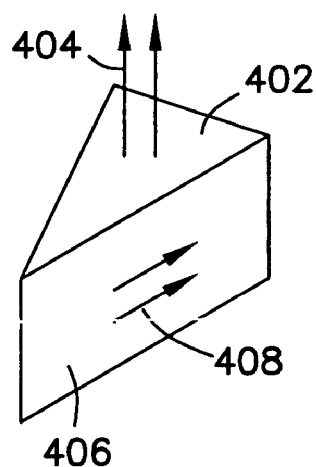
FIG. 4 is a silicon structure illustrating embodiments of crystal plane orientations of surfaces and electrical current flow directions.

FIG. 4 illustrates one embodiment wherein an electrical current flow in a <110> direction. In particular, FIG. 4 is a silicon structure having a top surface 402. According to the teachings of the present invention, the top surface 402 has a (100) crystal plane orientation. FIG. 4 also illustrates a direction 404 coming from the top surface 402, which is essentially perpendicular to such surface. Electrical current flow in direction 404 is in a <100> direction. Additionally, the silicon structure of FIG. 4 has a side surface 406, which has a (110) crystal plane orientation. FIG. 4 also illustrates a direction 408, which runs essentially parallel to the side surface 406 and the top surface 402. Electrical current flow in direction 408 is in a <110> direction.

Figure 5:
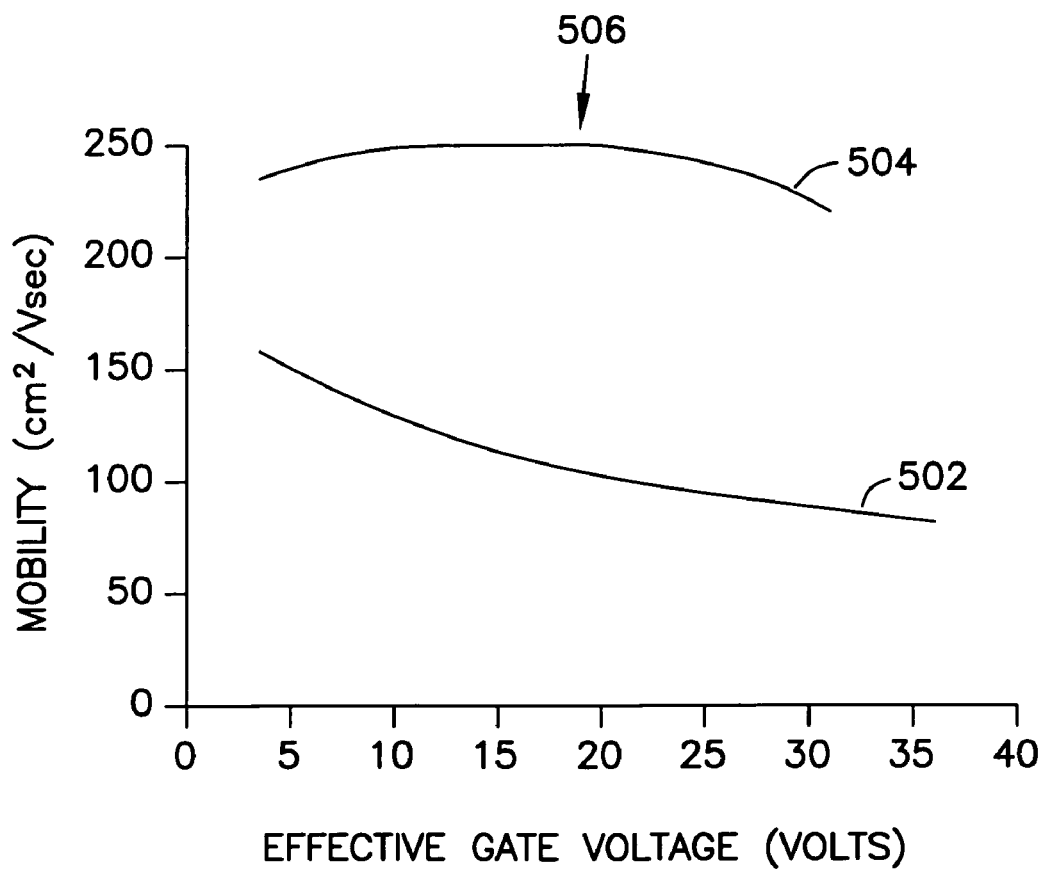
FIG. 5 is a graph that illustrates inversion layer hole mobility vs. effective gate voltage.

As illustrated in FIG. 5, the room temperature hole mobility for a PMOS device and the resultant electrical current in the PMOS device formed according to the teachings of the present invention is approximately two and a half times faster than a conventional planar device formed on a surface with a (100) crystal plane orientation. Because circuit performance is typically limited by the electrical current through PMOS devices, advantageously, a corresponding increase in performance for most logic applications generally occurs due to this increase in the speed of electrical current through PMOS devices.

In particular, the graph of FIG. 5 illustrates inversion layer hole mobility, expressed in velocity in centimeters per second divided by the field in V per centimeter, e.g. ($cm^2$/Vsec), versus effective gate voltage, e.g.—($V_G$-$V_T$), expressed in volts (V), at a temperature of approximately 297° Kelvin (° K). FIG. 5 includes a plot 502 and a plot 504. The plot 502 is the graphical plot of hole mobility versus a gate voltage for a MOSFET device on a silicon surface conducting in the <100> direction. The plot 504 is the graphical plot of hole mobility versus a gate voltage for a MOSFET device on a silicon surface having a (110) crystalline plane orientation and conducting in the <110> direction. As illustrated in a region of normal operation 506, the plot 504 has a hole mobility of approximately 250 $cm^2$/V*sec. In contrast, as illustrated in the region of normal operation 506, the plot 502 only has a hole mobility of approximately 100 $cm^2$/V*sec. Thus, according to the teachings of the present invention, the formation and orientation of circuit devices lateral to surfaces having a (110) crystalline plane orientation in which the electrical current of such devices is flowing in the <110> direction allows for increases in the overall performance of such devices as well as of circuits which contain such devices.

FIGS. 6A-6F illustrate a preferred embodiment of a process of fabrication of conduction regions on a silicon wafer according to the teachings of the present invention. The sequence can be followed as a method of forming an integrated circuit, as a method of forming a semiconductor device, as a method of forming an integrated circuit that includes a number of lateral transistors and as a method of forming a MOSFET device.

Figure 6A:
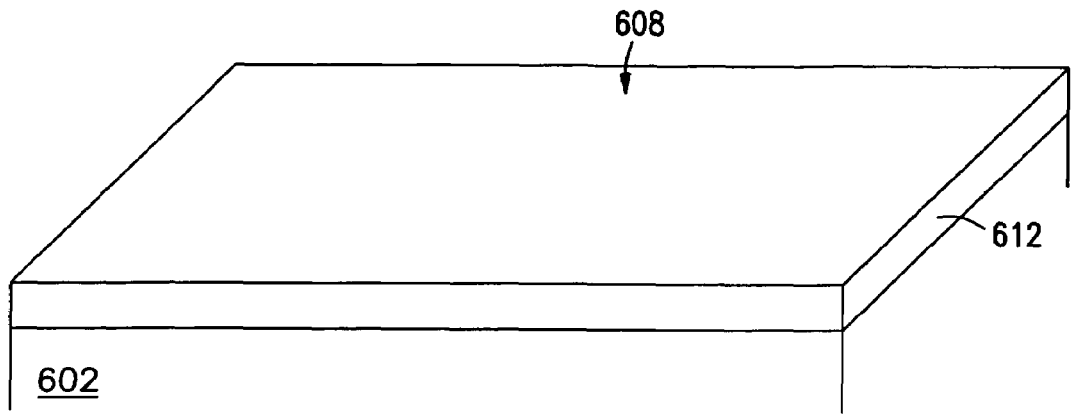
FIGS. 6A-6F illustrate an embodiment of a process of fabrication of conduction regions on a silicon wafer according to the teachings of the present invention.

FIG. 6A shows the structure after the first sequence of processing. A doped silicon layer 612 is grown on silicon wafer 602. In one embodiment, the silicon wafer 602 has a top surface 608 that has a (100) crystal plane orientation. However, it is important to appreciate that the top surface 608 may have other crystal plane orientations (e.g., (111) crystal plane orientation). In one embodiment, the silicon wafer 602 includes a bulk silicon material. In an alternative embodiment, the silicon wafer 602 includes a Silicon On Insulator (SOI) material. In one embodiment, the doped silicon layer 612 includes an n-type. In an alternative embodiment, the doped silicon layer 612 includes a p-type.

Figure 6B:
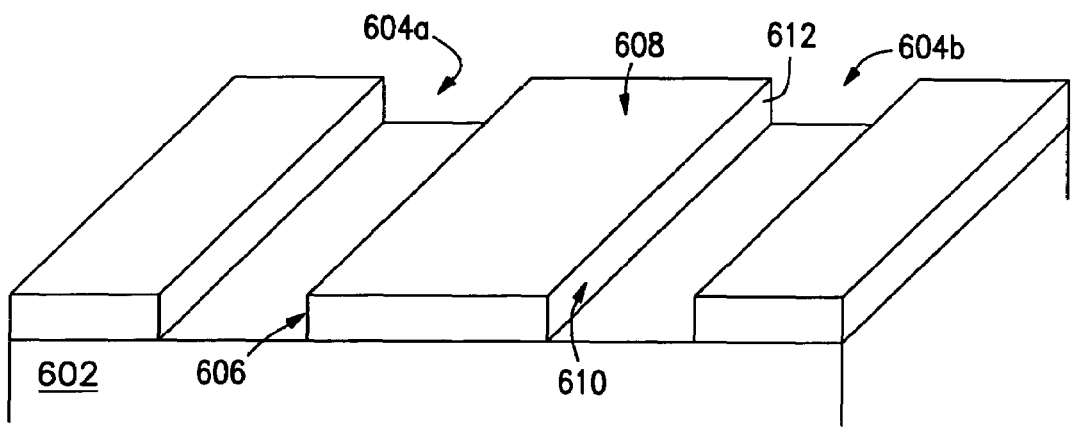

FIG. 6B shows the structure after the next sequence of processing. Trenches 604a-b are formed in the doped silicon layer 612, using conventional photolithography and etching techniques. In particular, the trenches 604a-b are specifically formed such that a first and a second trench wall 606 and 610 of the trenches 604a-b, respectively, have a (110) crystal plane orientation.

Figure 6C:
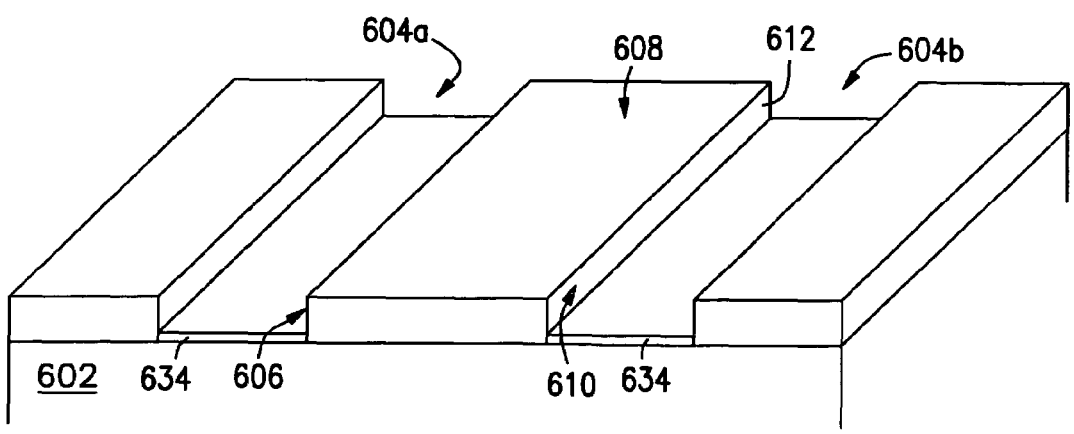

FIG. 6C shows the structure after the next sequence of processing. A thin silicon nitride ($Si_3Ni_4$) layer 634 is deposited by any suitable method, such as chemical vapor deposition (CVD), over the entire surface. The thin silicon nitride layer 634 is selectively etched to leave a thin layer on the bottom of trenches 604a-b.

Figure 6D:
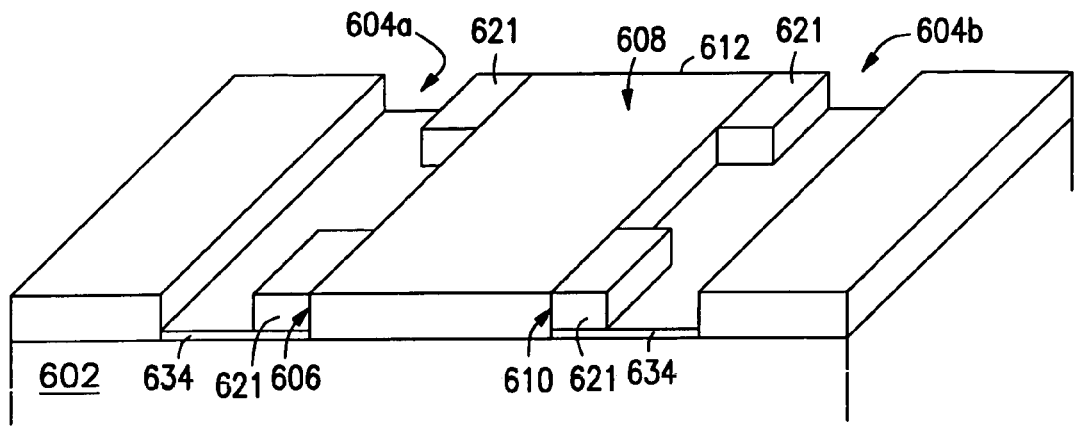

FIG. 6D shows the structure after the next sequence of processing. A heavily doped glass layer 621, which is of a different type than the type of the doped silicon layer 612, is deposited across the entire surface. In one such embodiment, the doped silicon layer 612 is an n-type semiconductor material, and the heavily doped glass layer 621 contains p-type dopant. In another such embodiment, the doped silicon layer 612 is a p-type semiconductor material, and the heavily doped glass layer 621 contains n-type dopant. The heavily doped glass layer 621 is deposited by any suitable means, such as by CVD. The heavily doped glass layer 621 is then selectively etched to leave specific portions of the trenches 604a-b, as shown in FIG. 6D.

Figure 6E:
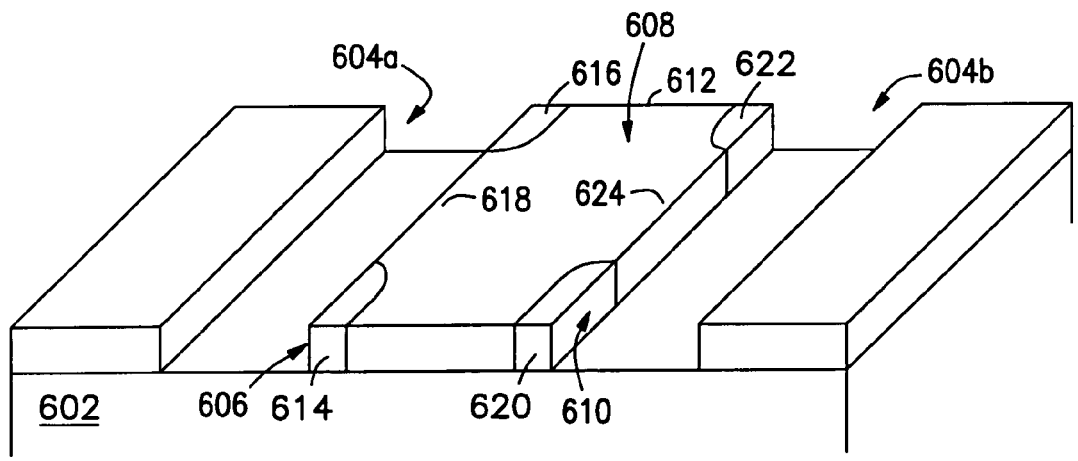

FIG. 6E shows the structure after the next sequence of processing. The structure undergoes an anneal, such as a rapid thermal anneal (RTA), in order to drive the dopant species from the heavily doped glass layer 621 into the lateral walls of doped silicon layer 612. Accordingly, a first conductive region 614 or first conductive region of a first type 614 is formed in the doped silicon layer 612. A second conductive region 616 or second conductive region of a first type 616 is also formed in the doped silicon layer 612. In particular, the second conductive region 616 is formed in reference to the first conductive region 614 to cause the formation of a third conductive region 618 or a conductive region of a second type 618, in between the first conductive region 614 and the second conductive region 616 within the doped silicon layer 612.

Further, a fourth conductive region 620 and a fifth conductive region 622 are formed in the doped silicon layer 612. In particular, the fifth conductive region 622 is formed in reference to the fourth conductive region 620 to cause the formation of a sixth conductive region 624 in between the fourth conductive region 620 and the fifth conductive region 622 within the doped silicon layer 612.

In one embodiment, the third and sixth conductive regions 618 and 624 include an n-type semiconductor material. In another embodiment, the third and sixth conductive regions 616 and 624 include a p-type. In one embodiment, the third and sixth conductive regions 618 and 624 are of a different type conductive material in comparison with the first, second, fourth and fifth conductive regions 614, 616, 620 and 622.

Additionally, an electrical current is capable of flowing between the first conductive region 614 and the second conductive region 616 through the third conductive region 618 in a <110> direction, e.g. parallel to the top surface 608 of the silicon wafer 602. In one embodiment, the electrical current is capable of flowing between the first conductive region 614 and the second conductive region 616 through the third conductive region 618 lateral to the first trench wall 606.

Further, an electrical current is capable of flowing between the fourth conductive region 620 and the fifth conductive region 622 through the sixth conductive region 624 in a <110> direction, e.g. parallel to the top surface 608 of the silicon wafer 602. In one embodiment, the electrical current is capable of flowing between the fourth conductive region 620 and the fifth conductive region 622 through the sixth conductive region 624 lateral to the second trench wall 610.

Figure 6F:
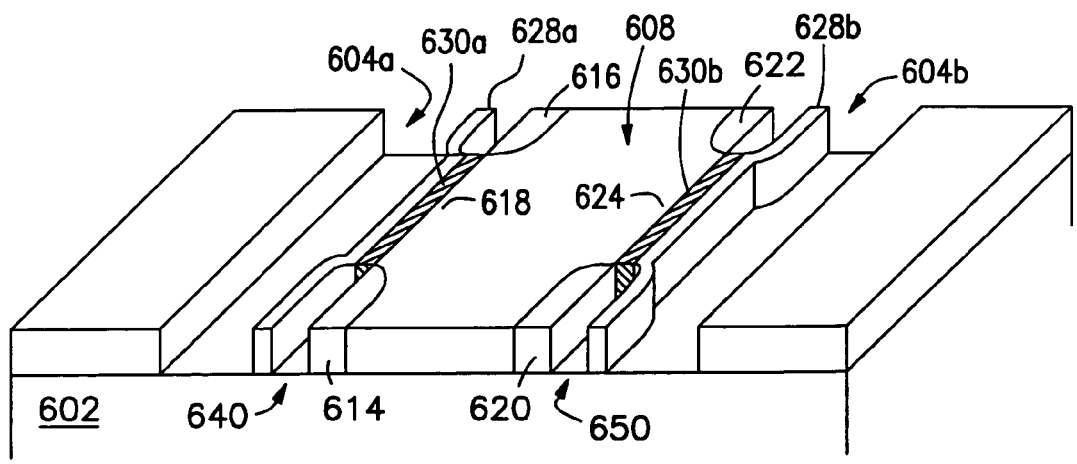

FIG. 6F shows the structure after the next sequence of processing. In particular, word lines 628a and 628b along with corresponding gate oxides 630a and 630b are formed lateral to the trench walls 606 and 610 of silicon wafer 602, using standard photolithography and deposition techniques. In one embodiment, word lines 628a and 628b include gates formed lateral to the gate oxides, 630a and 630b respectively. In one embodiment, word lines 628a and 628b are conductive lines constructed from a polysilicon. In one embodiment, the configuration illustrated in FIG. 6F includes two access transistors used in conjunction with a DRAM.

In one embodiment, the third and sixth conductive regions 618 and 624 are body regions of a transistor capable of forming a channel when a voltage potential is applied to the gates of such transistor. While only lateral transistors 640 and 650 are shown in FIG. 6F, one skilled in the art will recognize the repeatable structure shown and that any number of lateral transistors can be formed from the above described process and used in an array, hence, the details of a longer array are not disclosed in the present application.

Figure 7A:
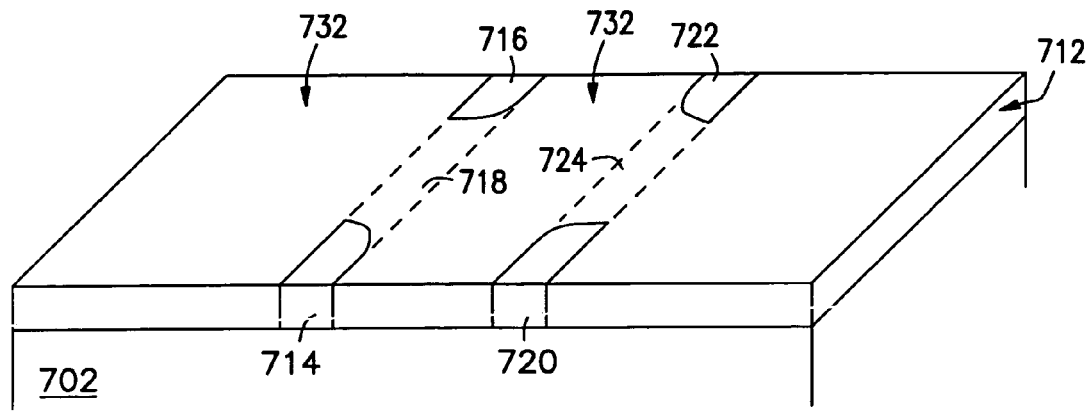
FIGS. 7A-7C illustrate another embodiment of a process of fabrication of conduction regions on a silicon wafer according to the teachings of the present invention.
Figure 7B:
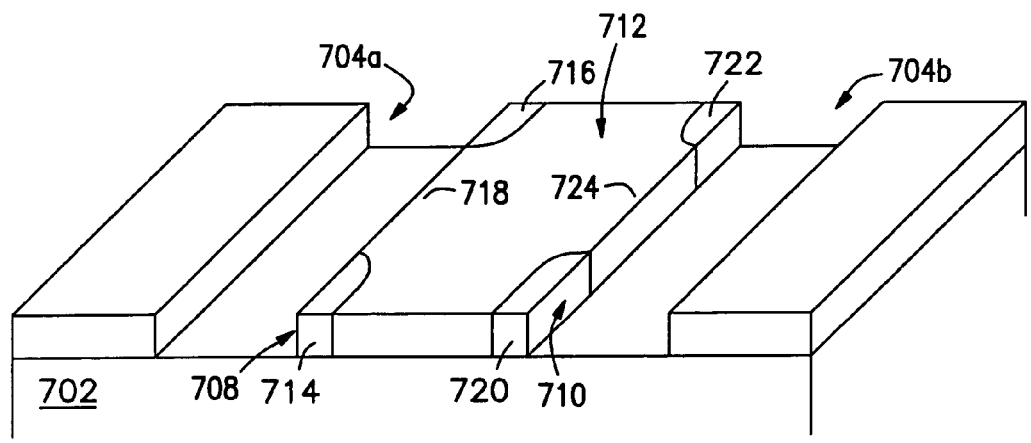
Figure 7C:
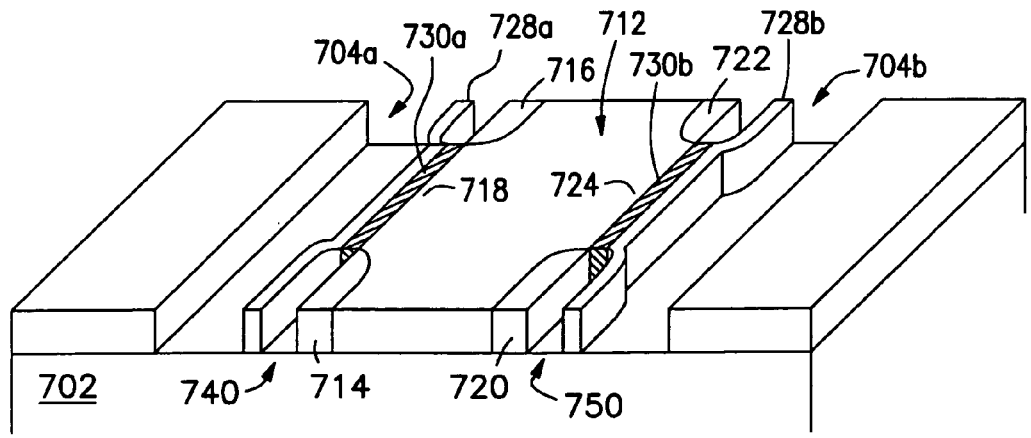

FIGS. 7A-7C illustrate another embodiment of a process of fabrication of conduction regions on a silicon wafer according to the teachings of the present invention. The sequence can be followed as a method of forming an integrated circuit, as a method of forming a semiconductor device, as a method of forming an integrated circuit that includes a number of lateral transistors and as a method of forming a MOSFET device.

FIG. 7A shows the structure after the first sequence of processing. A doped silicon layer 712 is grown on a silicon wafer 702. In one embodiment, the silicon wafer 702 has a top surface 732 that has a (100) crystal plane orientation. However, it is important to appreciate that the top surface 732 may have other crystal plane orientations (e.g., (111) crystal plane orientation). In one embodiment, the silicon wafer 702 includes a bulk silicon material. In an alternative embodiment, the silicon wafer 702 includes a Silicon On Insulator (SOI) material.

In one embodiment, the doped silicon layer 712 includes an n-type. In an alternative embodiment, the doped silicon layer 712 includes a p-type. Additionally, a first conductive region 714 or first conductive region of a first type 714 is formed in the doped silicon layer 712, using, for example, ion implantation techniques. A second conductive region 716 or second conductive region of a first type 716 is also formed in the doped silicon layer 712. The second conductive region 716 can also be formed using, for example, ion implantation techniques. In particular, the second conductive region 716 is formed in reference to the first conductive region 714 to cause the formation of a third conductive region 718 or a conductive region of a second type 718, in between the first conductive region 714 and the second conductive region 716 within the doped silicon layer 712.

Further, a fourth conductive region 720 and a fifth conductive region 722 are formed in the doped silicon layer 712, using, for example, ion implantation techniques. In particular, the fifth conductive region 722 is formed in reference to the fourth conductive region 720 to cause the formation of a sixth conductive region 724 in between the fourth conductive region 720 and the fifth conductive region 722 within the doped silicon layer 712.

In one embodiment, the first, second, fourth and fifth conductive regions 714, 716, 720 and 722 include an n-type. In another embodiment, the first, second, fourth and fifth conductive regions 714, 716, 720 and 722 include a p-type. In one embodiment, the first and fourth conductive regions 714 and 720 are source regions and the second and fifth conductive regions 716 and 722 are drain regions of a transistor.

FIG. 7B shows the structure after the next sequence of processing. Trenches 704*a-b* are etched in the silicon wafer 702 using conventional photolithography and etching techniques. In particular, the trenches 704*a-b* are specifically etched such that a first and a second trench wall 708 and 710 of trenches 704*a-b*, respectively, have a (110) crystal plane orientation. Moreover, the first and the second trench walls 708 and 710 are specifically etched in the first, second and third conductive regions and the fourth, fifth and sixth conductive regions, respectively, of the silicon wafer 702.

Additionally, an electrical current is capable of flowing between the first conductive region 714 and the second conductive region 716 through the third conductive region 718 in a <110> direction, e.g. parallel to the top surface 708 of the silicon wafer 702. In one embodiment, the electrical current is capable of flowing between the first conductive region 714 and the second conductive region 716 through the third conductive region 718 lateral to the first trench wall 708.

Further, an electrical current is capable of flowing between the fourth conductive region 720 and the fifth conductive region 722 through the sixth conductive region 724 in a <110> direction, e.g. parallel to the top surface 708 of the silicon wafer 702. In one embodiment, the electrical current is capable of flowing between the fourth conductive region 720 and the fifth conductive region 722 through the sixth conductive region 724 lateral to the second trench wall 710.

FIG. 7C shows the structure after the next sequence of processing. In particular, word lines 728*a* and 728*b* along with corresponding gate oxides 730*a* and 730*b* are formed lateral to the trench walls 708 and 710 of silicon wafer 702, using standard photolithography and deposition techniques. In one embodiment, word lines 728*a* and 728*b* include gates formed lateral to the gate oxides, 730*a* and 730*b* respectively. In one embodiment, word lines 728*a* and 728*b* are conductive lines constructed from a polysilicon. In one embodiment, the configuration illustrated in FIG. 7C includes two access transistors used in conjunction with a DRAM.

In one embodiment, the third and sixth conductive regions 718 and 724 are body regions of a transistor capable of forming a channel when a voltage potential is applied to the gates of such transistor. In one embodiment, the third and sixth conductive regions 718 and 724 include an n-type semiconductor material. In another embodiment, the third and sixth conductive regions 716 and 724 include a p-type. In one embodiment, the third and sixth conductive regions 718 and 724 are of a different type conductive material in comparison with the first, second, fourth and fifth conductive regions 714, 716, 720 and 722.

While only lateral transistors 740 and 750 are shown in FIG. 7C, one skilled in the art will recognize the repeatable structure shown and that any number of lateral transistors can be formed from the above described process and used in an array, hence, the details of a longer array are not disclosed in the present application.

Figure 8A:
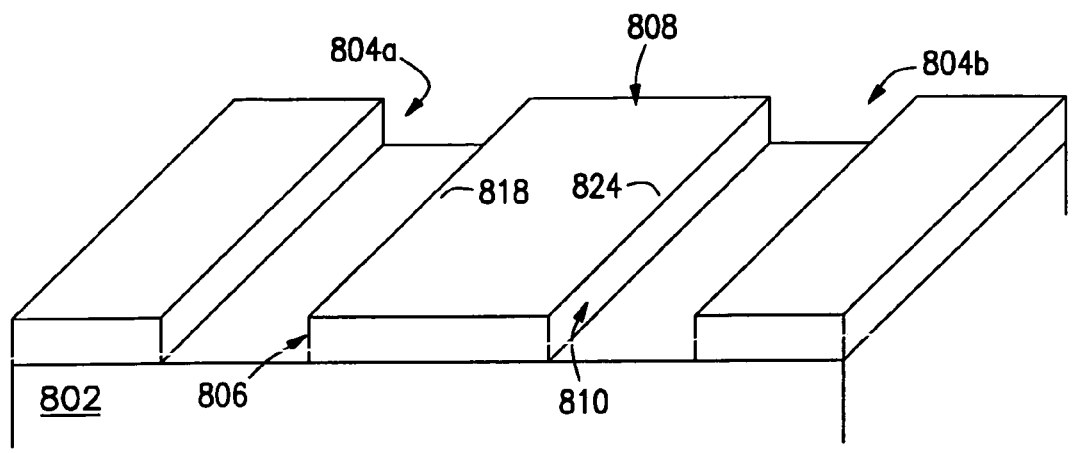
FIGS. 8A-8C illustrate another embodiment of a process of fabrication of conduction regions on a silicon wafer according to the teachings of the present invention.
Figure 8B:
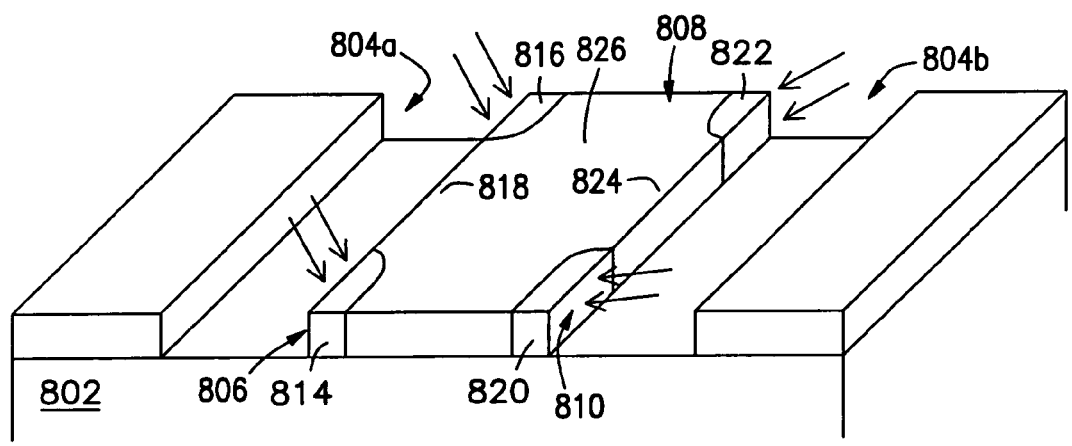
Figure 8C:
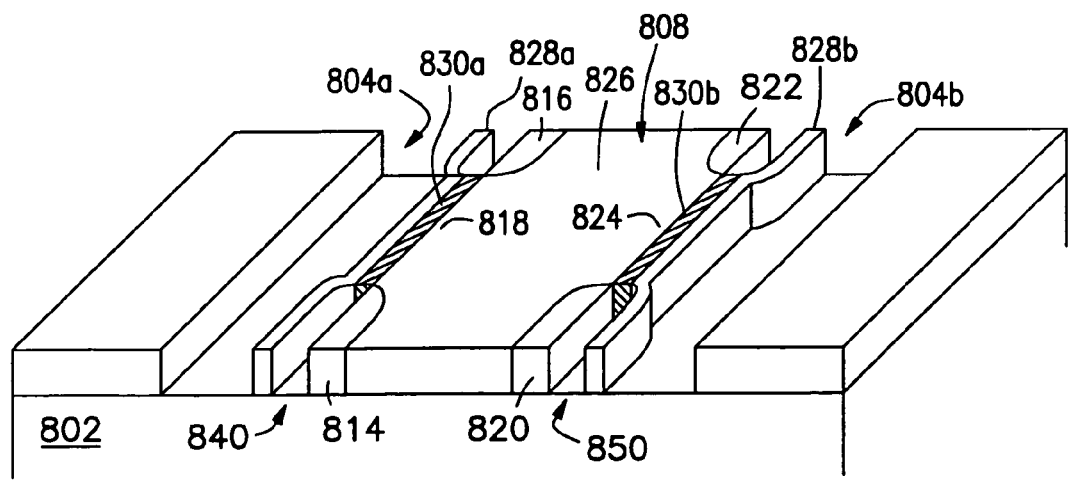

FIGS. 8A-8C illustrate another embodiment of a process of fabrication of conduction regions on a silicon wafer according to the teachings of the present invention. The sequence can be followed as a method of forming an integrated circuit, as a method of forming a semiconductor device, as a method of forming an integrated circuit that includes a number of lateral transistors and as a method of forming a MOSFET device.

FIG. 8A shows the structure after the first sequence of processing. Trenches 804*a-b* are formed in a silicon wafer 802, using conventional photolithography and etching techniques. In particular, the trenches 804*a-b* are specifically formed such that a first and a second trench wall 806 and 810 of the trenches 804*a-b*, respectively, have a (110) crystal plane orientation. In one embodiment, the silicon wafer 802 has a top surface 808 that has a (100) crystal plane orientation. However, it is important to appreciate that the top surface 808 may have other crystal plane orientations (e.g., (111) crystal plane orientation). In one embodiment, the silicon wafer 802 includes a bulk silicon material. In an alternative embodiment, the silicon wafer 802 includes a Silicon On Insulator (SOI) material.

FIG. 8B shows the structure after the next sequence of processing. In particular, regions in the trench walls 806 and 810 are doped using, for example, angled ion implantation, as shown. The doped regions include (1) a first conductive region 814 or a first conductive region of a first type 814, (2) a second conductive region 816 or a second conductive region of a first type 816, (3) a fourth conductive region 820, (4) a fifth conductive region 822, and (5) a remaining region 826 of the top surface 808. The remaining region 826 includes a third conductive region 818 or a conductive region of a second type 818 and a sixth conductive region 824.

The doped regions are formed such that the second conductive region 816 is formed in reference to the first conductive region 814 to cause the formation of the third conductive region 818 in between the first conductive region 814 and the second conductive region 816. Additionally, the fifth conductive region 822 is formed in reference to the fourth conductive region 820 to cause the formation of the sixth conductive region 824 in between the fourth conductive region 820 and the fifth conductive region 822.

In one embodiment, the remaining region 826, which includes the third conductive region 818 and sixth conductive region 824, is a different type conductive material in comparison with the first, second, fourth and fifth conductive regions 814, 816, 820 and 822, respectively. In one such embodiment, the remaining region 826 is an n-type, while the first, second, fourth and fifth conductive regions 814, 816, 820 and 822, respectively, are a p-type. In another such embodiment, the remaining region 826 is a p-type, and the first, second, fourth and fifth conductive regions 814, 816, 820 and 822, respectively, are an n-type. In one embodiment, the first and fourth conductive regions 814 and 820 are source regions and the second and fifth conductive regions 816 and 822 are drain regions of a transistor. In one embodiment, the third and sixth conductive regions 818 and 824 are body regions of a transistor capable of forming a channel when a voltage potential is applied to the gates of such transistor.

Additionally, an electrical current is capable of flowing between the first conductive region 814 and the second conductive region 816 through the third conductive region 818 in a <110> direction, e.g. parallel to the top surface 808 of the silicon wafer 802. In one embodiment, the electrical current is capable of flowing between the first conductive region 814 and the second conductive region 816 through the third conductive region 818 lateral to the first trench wall 806, which has a (110) crystal plane orientation.

Further, an electrical current is capable of flowing between the fourth conductive region 820 and the fifth conductive region 822 through the sixth conductive region 824 in a <110> direction, e.g. parallel to the top surface 808 of the silicon wafer 802. In one embodiment, the electrical current is capable of flowing between the fourth conductive region 820 and the fifth conducive region 822 through the sixth conductive region 824 lateral to the second trench wall 810, which has a (110) crystal plane orientation.

FIG. 8C shows the structure after the next sequence of processing. In particular, word lines 828a and 828b along with corresponding gate oxides 830a and 830b are formed lateral to the trench walls 806 and 810 of silicon wafer 802, using standard photolithography and deposition techniques. In one embodiment, word lines 828a and 828b include gates formed lateral to the gate oxides, 830a and 830b respectively. In one embodiment, word lines 828a and 828b are conductive lines constructed from a polysilicon. In one embodiment, the configuration illustrated in FIG. 8C includes two access transistors used in conjunction with a DRAM.

While only lateral transistors 840 and 850 are shown in FIG. 8C, one skilled in the art will recognize the repeatable structure shown and that any number of lateral transistors can be formed from the above described process and used in an array, hence, the details of a longer array are not disclosed in the present application.

Figure 9:
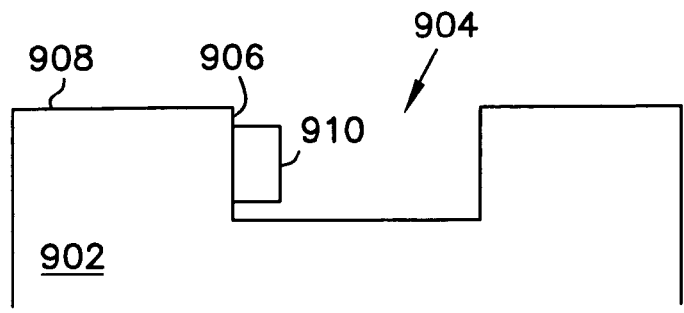
FIG. 9 is a cross-sectional view of an embodiment of an integrated circuit according to the teachings of the present invention.

FIG. 9 is a cross-sectional view of an embodiment of an integrated circuit according to the teachings of the present invention. The integrated circuit of FIG. 9 is constructed in a similar manner according to any one of the methods presented in this application. The integrated circuit includes a trench wall 906 of a trench 904 in a silicon wafer 902. According to the teachings of the present invention, the trench wall 906 has a (110) crystal plane orientation. In one embodiment, the silicon wafer 902 has a top surface 908 that has a (100) crystal plane orientation. However, it is important to appreciate that the top surface 908 may have other crystal plane orientations (e.g., (111) crystal plane orientation). In one embodiment, the silicon wafer 902 includes a bulk silicon material. In an alternative embodiment, the silicon wafer 902 includes a Silicon On Insulator (SOI) material.

The integrated circuit of FIG. 9 also includes a semiconductor device 910 which is lateral to the trench wall 906. Specifically, according to the teachings of the present invention, the semiconductor device 910 is designed for or configured for conducting an electrical current in the <110> direction. In one embodiment, the semiconductor device 910 is a MOSFET device. In one such embodiment, the semiconductor device 910 is a p-MOSFET device. In another such embodiment, the semiconductor device 910 is a n-MOSFET device.

Figure 10:
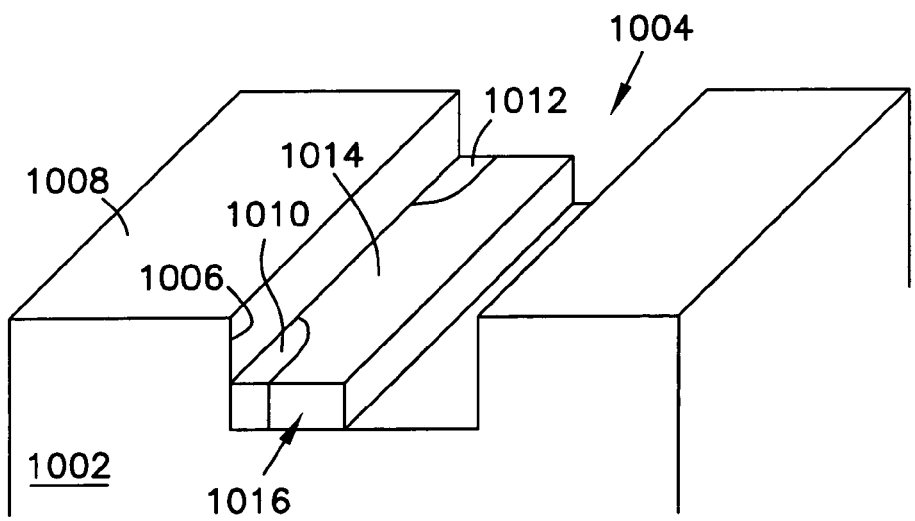
FIG. 10 is a cross-sectional view of an embodiment of a semiconductor device according to the teachings of the present invention.

FIG. 10 is a cross-sectional view of an embodiment of a device according to the teachings of the present invention. The device of FIG. 10 is constructed in a similar manner according to any one of the methods presented in this application. Additionally, in one embodiment, the device of FIG. 10 is a semiconductor device. In one embodiment, the device of FIG. 10 is a MOSFET device. In one such embodiment, the device is an n-MOSFET device. In another embodiment, the device is a p-MOSFET device. In another embodiment, the device is a portion of a dynamic random access memory (DRAM) having an array of transistors. In one embodiment, the device is a portion of an array of MOSFETs. In another embodiment, the device of FIG. 10 is a portion of an integrated circuit.

While only one device 1016 is shown in FIG. 10, one skilled in the art will recognize the repeatable structure shown and that any number of similar devices can be formed from the above described process and used as a portion of a DRAM, in an array, or portion of an integrated circuit. Hence, the details of a longer array are not disclosed in the present application.

The device includes a first conductive region 1010 in a trench 1004 of a silicon wafer 1002. The first conductive region 1010 is of a first type and is lateral to a trench wall 1006 of the trench 1004. Additionally, the trench wall 1006 has a (110) crystal plane orientation. In one embodiment, the first type is an n-type. In another embodiment, the first type is a p-type. In one embodiment, the silicon wafer 1002 has a top surface 1008, which has a (100) crystal plane orientation.

The device of FIG. 10 also includes a second conductive region 1012 in the trench 1004. The second conductive region 1012 is of the first type and is lateral to the trench wall 1006. Additionally, the device of FIG. 10 includes a third conductive region 1014 in the trench 1004. The third conductive region 1014 is of a second type and is lateral to the trench wall 1006. An electrical current is also capable of flowing between the first conductive region 1010 and the second conductive region 1012 in a <110> direction. In one embodiment, the third conductive region 1014 is a body region of a MOSFET device.

Figure 11:
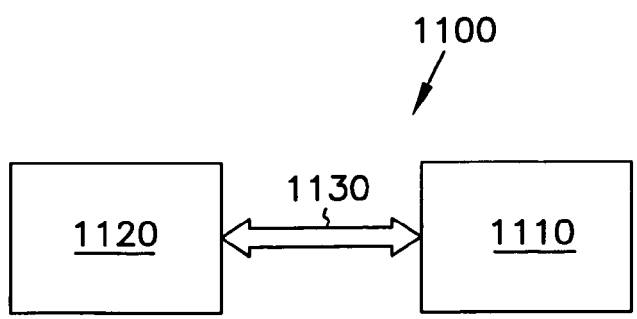
FIG. 11 is a block diagram which illustrates an embodiment of a system according to teachings of the present invention.

FIG. 11 is a block diagram which illustrates an embodiment of a system 1100 according to teachings of the present invention. The system 1100 includes an integrated circuit 1110 which can include a memory, e.g. a DRAM. The integrated circuit 1110 includes the embodiments of a device in a trench of a semiconductor wafer according to the structures and methods described above in this application. In particular, the device is lateral to a trench wall of the trench such that the trench wall has a (110) crystal plane orientation and an electrical current is capable of flowing in the device in a <110> direction, all according to the teachings of the present invention. Additionally, the system 1100 includes a processor 1120 that is operatively coupled to the integrated circuit 1110. The processor 1120 is coupled to the integrated circuit 1110 through a bus 1130. In one embodiment, the processor 1120 and the integrated circuit 1110 are on the same semiconductor chip.

CONCLUSION

Thus, improved methods and structures are provided that are lateral to surfaces with a (110) crystal plane orientation such that an electrical current of such structures is in a <110> direction. Advantageously, improvements in hole carrier mobility of approximately 50% can be obtained by orienting the structure's channel in a (110) plane such that the electrical current flow is in the <110> direction. Moreover, these improved methods and structures can be used in conjunction with existing fabrication and processing techniques with minimal or no added complexity.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of forming a transistor, comprising:
   forming a trench in a silicon wafer such that a trench wall of the trench has a (110) crystal plane orientation;
   forming a first source/drain region and a second source/drain region lateral to a wall of the trench with a channel region therebetween; and
   wherein the transistor is oriented to selectively conduct an electrical current across the channel region in a direction parallel to a top surface of the wafer.

2. The method of claim 1, wherein the electrical current across the channel region is in a <110> direction.

3. The method of claim 1, wherein forming the trench in a silicon wafer includes forming a trench in a silicon wafer with a top surface in the (100) crystal plane orientation.

4. A method of forming a transistor, comprising:
   forming a trench in a silicon wafer such that a trench wall of the trench has a (110) crystal plane orientation;
   forming a first source/drain region and a second source/drain region lateral to a wall of the trench with a channel region therebetween, wherein forming each source/drain region includes:
      forming a doped material structure against the wall of the trench;
      diffusing dopants from the doped material structure into the wall of the trench;
      removing the doped material structure from the trench; and
   wherein the transistor is oriented to selectively conduct an electrical current across the channel region in a direction parallel to a top surface of the wafer.

5. The method of claim 4, wherein forming the trench in a silicon wafer includes forming a trench in a silicon-on-insulator (SOI) silicon wafer.

6. The method of claim 4, wherein the electrical current across the channel region is in a <110> direction.

7. The method of claim 4, wherein forming a doped material structure includes forming a doped glass structure.

8. The method of claim 4, wherein diffusing dopants from the doped material structure includes rapid thermal annealing.

9. The method of claim 4, further including forming an Si3N4 diffusion barrier layer in a bottom of the trench prior to forming the doped material structure within the trench.

10. A method of forming a transistor, comprising:
    forming a trench in a silicon wafer such that a trench wall of the trench has a (110) crystal plane orientation;
    forming a first source/drain region and a second source/drain region lateral to a wall of the trench with a channel region therebetween, wherein forming each source/drain region includes:
       ion implanting dopants into the wafer surface prior to forming the trench to form doped regions of a first type within a surface wafer material of a second type;
       forming the trench between ion implanted regions after formation of the doped regions; and
    wherein the transistor is oriented to selectively conduct an electrical current across the channel region in a direction parallel to a top surface of the wafer.

11. The method of claim 10, wherein the doped regions include n-type dopants and the channel includes p-type dopants.

12. The method of claim 10, wherein the doped regions include p-type dopants and the channel includes n-type dopants.

13. The method of claim 10, wherein forming the trench in a silicon wafer includes forming a trench in a silicon wafer with a top surface in the (100) crystal plane orientation.

14. The method of claim 10, wherein the electrical current across the channel region is in a <110> direction.

15. A method of forming a transistor, comprising:
    forming a trench in a silicon wafer such that a trench wall of the trench has a (110) crystal plane orientation;
    forming a first source/drain region and a second source/drain region lateral to a wall of the trench with a channel region therebetween, wherein forming each source/drain region includes angled ion implanting dopants into the trench wall to form doped regions of a first type within a wall material of a second type; and
    wherein the transistor is oriented to selectively conduct an electrical current across the channel region in a direction parallel to a top surface of the wafer.

16. The method of claim 15, wherein the doped regions include n-type dopants and the channel includes p-type dopants.

17. The method of claim 15, wherein the doped regions include p-type dopants and the channel includes n-type dopants.

18. The method of claim 15, wherein forming the trench in a silicon wafer includes forming a trench in a silicon wafer with a top surface in the (111) crystal plane orientation.

19. The method of claim 15, wherein the electrical current across the channel region is in a <110> direction.

20. A method of forming a memory device, comprising:
    forming a number of memory cells, each cell including at least one transistor, wherein forming the transistor includes:
       forming a trench in a silicon wafer such that a trench wall of the trench has a (110) crystal plane orientation;
       forming a first source/drain region and a second source/drain region lateral to a wall of the trench with a channel region therebetween;
       wherein the transistor is oriented to selectively conduct an electrical current across the channel region in a direction parallel to a top surface of the wafer; and
    forming storage and access circuitry coupled to the number of memory cells.

21. The method of claim 20, wherein forming a number of memory cells includes forming a number of dynamic random access memory (DRAM) cells.

22. The method of claim 20, wherein forming the transistor includes forming a p-channel transistor.

23. A method of forming an electronic system, comprising:
    forming a memory device coupled to a processor, wherein forming the memory device includes forming a number of memory cells, each cell including at least one transistor, wherein forming the transistor includes:

forming a trench in a silicon wafer such that a trench wall of the trench has a (110) crystal plane orientation;

forming a first source/drain region and a second source/drain region lateral to a wall of the trench with a channel region therebetween;

wherein the transistor is oriented to selectively conduct an electrical current across the channel region in a direction parallel to a top surface of the wafer; and forming storage and access circuitry coupled to the number of memory cells.

24. The method of claim 23, wherein forming a memory device includes forming a dynamic random access memory (DRAM).

25. The method of claim 23, wherein the electrical current across the channel region is in a <110> direction.

26. The method of claim 23, wherein forming the trench in a silicon wafer includes forming a trench in a silicon wafer with a top surface in the (100) crystal plane orientation.

* * * * *

UNITED STATES PATENT AND TRADEMARK OFFICE
CERTIFICATE OF CORRECTION

PATENT NO. : 7,282,400 B2 Page 1 of 1
APPLICATION NO. : 11/358583
DATED : October 16, 2007
INVENTOR(S) : Noble et al.

It is certified that error appears in the above-identified patent and that said Letters Patent is hereby corrected as shown below:

In column 15, line 55, in Claim 9, delete "Si3N4" and insert -- $Si_3N_4$ --, therefor.

Signed and Sealed this

Twenty-fifth Day of December, 2007

JON W. DUDAS
*Director of the United States Patent and Trademark Office*